United States Patent [19]

Fulenwider

[11] 4,016,556

[45] Apr. 5, 1977

[54] OPTICALLY ENCODED ACOUSTIC TO DIGITAL TRANSDUCER

[75] Inventor: John E. Fulenwider, Concord, Mass.

[73] Assignee: GTE Laboratories Incorporated, Waltham, Mass.

[22] Filed: Mar. 31, 1975

[21] Appl. No.: 563,868

[52] U.S. Cl. .......................... 340/347 P; 179/1 SC

[51] Int. Cl.² .......................................... H03K 13/02

[58] Field of Search ................ 340/347 P, 347 AD; 250/231 SE; 235/61.11 E; 179/1 VC, 1 SA, 1 SC

[56] References Cited

UNITED STATES PATENTS

| | | | |
|---|---|---|---|
| 2,679,644 | 5/1954 | Lippel et al. | 340/347 P |
| 3,043,962 | 7/1962 | Jones | 340/347 P |
| 3,114,144 | 12/1963 | Woo | 340/347 P |
| 3,231,884 | 1/1966 | Higgins | 340/347 P |
| 3,641,564 | 2/1972 | Fassett et al. | 340/347 P |
| 3,666,925 | 5/1972 | Marcus | 340/347 P |
| 3,913,095 | 10/1975 | Dlugos | 340/347 P |
| R27,728 | 8/1973 | Kosker et al. | 340/347 P |

*Primary Examiner*—Thomas J. Sloyan

*Attorney, Agent, or Firm*—Irving M. Kriegsman; Leslie J. Hart

[57] ABSTRACT

A transducer converts an acoustic signal into a digital pulse code signal through optical encoding techniques. A pulsed light source emits a beam of light along a predetermined path. A digital optical encoder is located in the path and emits a digitally encoded light beam having regions in which light is present and regions in which there is an absence of light. A rotatable mirror which is located in the path of the encoded beam is connected to a diaphragm so that the angle of deflection of the encoded beam is a function of the acoustic signal. An array of digitally encoded photoconductive elements is located in the path of the deflected encoded beam. Threshold circuitry monitors the variation in the resistance of the photoconductive elements and produces an N bit digital pulse code representative of the magnitude and polarity of the acoustic signal during each occurrence of a pulsed light beam.

13 Claims, 5 Drawing Figures

OPTICALLY ENCODED ACOUSTIC TO DIGITAL TRANSDUCER

BACKGROUND OF THE INVENTION

The present invention relates to the art of pulse code modulated telecommunication systems, and, more specifically, to a telecommunication system and to a transducer in which the pulse code modulation is generated at each telephone handset. Pulse code modulation for use in telecommunication systems is not new, per se. In a typical system, a central office services a large number of telephone handsets. Each telephone is connected to the office by a pair of insulated wires. The wires connecting each telephone with the central office carries only analog signals. Pulse code modulation and demodualtion occurs at a central office and is used in time division multiplex interoffice trunking schemes. The central office includes switching circuitry and digital to analog and analog to digital converters as part of the pcm-tdm interoffice trunking circuitry. These converters are fairly sophisticated circuits. The advantage of this system is the ability of transmitting several signals from one central office to another over a single pair of wires. However, this system, as well as the non-pulse code modulated system, makes inefficient use of the cable connecting the telephones with the central office.

SUMMARY OF THE INVENTION

It is an object of the present invention to provide a new acoustic to pulse code transducer.

It is another object to provide a transducer for a telephone handset so that a digital pulse code is transmitted from the handset rather than an analog voice signal.

It is another object to provide a new optically encoded acoustic to digital transducer.

According to the present invention an acoustic to digital transducer is provided in which an optical encoding scheme is utilized. The transducer has a source of optical power for generating a beam of light. This beam is directed through a device which encodes the beam into a binary pattern of light. An array of photoconductive devices is also provided, the geometry of these devices being compatible with binary patterns of light such that an N bit binary code is generated as a function of the relative position of the encoded beam to the photoconductive array. Lastly, a device is provided for causing relative motion between the array and the binary encoded light beam.

In a preferred embodiment of the invention, the transducer is for use in a telephone handset. The optical power source is a pulsed, light emitting diode. The pulsed beam is directed to a shadow mask having an arrangement of light passing and light blocking regions. The encoded light beam is directed to a rotatable mirror, and the reflected encoded beam is then directed to the array of photoconductive elements. The mirror is connected to a diaphragm such that the angle of reflection of the encoded beam is a function of the acoustic energy received by the diaphragm. A threshold detector monitors the resistance variation in the photoconductive array and generates an N bit digital signal which is a function of the acoustic energy at the instant of the pulsed light beam. Preferably, the signal is converted to serial form for transmission.

DESCRIPTION OF PREFERRED EMBODIMENTS

Figure 1:
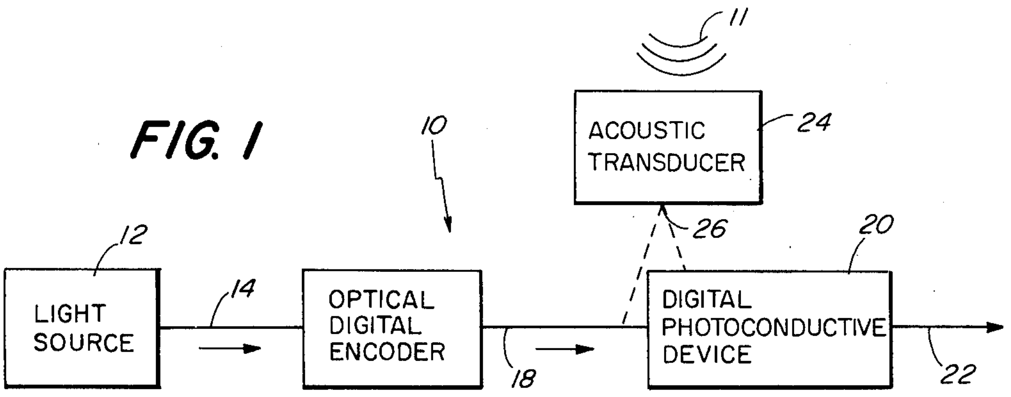
FIG. 1 is a block diagram of the optically encoded transducer according to the present invention.

Referring now to FIG. 1 of the drawing, there is illustrated a block diagram of an optical encoder, represented generally by the reference numeral 10, for use with mechanical sources of energy or acoustic sources of energy 11. In the present invention the transducer generates an N bit digital electrical signal which is a function of the acoustic energy at the instant of time in which the digital signal is generated. One use for the transducer is in a telephone handset in which the acoustic sound waves from the user of the telephone are converted into a digital pulse code. The transducer 10 includes a source 12 of optical power for generating a beam of light along a predetermined path represented by reference numeral 14. An optical digital encoder 16 is located in the path 14. This encoder converts the beam into an image of a preselected binary code of light having N bit levels. The output of the encoder 16 is an encoded beam 18 which has regions in which light is present and regions in which there is an absence of light. These light and dark regions represent the two levels ("1" and "0") of the binary number system. While the encoded beam 18 is shown as being parallel to the path 14 of the beam entering the encoder 16 (i.e., no deflection), it is to be understood that the encoded beam 18 may be deflected in the encoder 16. A digital photoconductive device 20 is disposed in the path of the encoded beam 18. The device 20 has photoconductive resistors in the shape of the preselected binary code. The function performed by the device 20 is to generate an N bit electrical signal representative of the relative position of the encoded beam upon the photoconductive resistors. The output of the device 20 is shown at 22 and is an N bit digital pulse code. Means, such as an acoustic transducer 24, respond to the sources of energy, such as the acoustic wave 11, by effecting relative motion, represented by the dotted lines 26, between the photoconductive resistors and the encoded beam. The magnitude and/or direction of the relative motion is a function of the magnitude and polarity of the source of energy 11.

Figure 2:
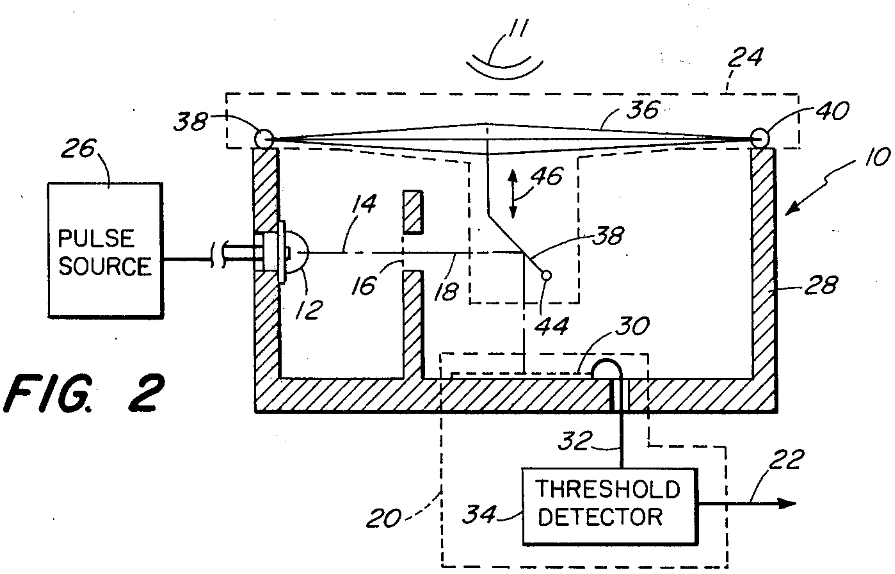
FIG. 2 is a partial sectional view and a partial block diagram of a preferred embodiment of the transducer for use in a telephone handset.

FIG. 2 is a partial sectional view and a partial block diagram of a preferred embodiment of the optically encoded transducer 10 which was illustrated more generally in FIG. 1. Preferbly, the transducer 10 includes a suitable sampling device so that the output 22 of the transducer is present at a preselected sampling rate. This may be accomplished by a pulse source 26 connected to the light source 12 so that the light source is on only during the duration of the pulse. In FIG. 2, the transducer is in a telephone handset, while the pulse source 26 is remotely located such as in the central office of a telecommunications network. The light source 12 preferably is a light emitting diode, such as model No. ME-7140 manufactured by Monsanto. A pulsed digital output 22 may also be obtained by a light source generating a constant output but using the pulse source 26 as a gating signal at the output 22. The former arrangement is preferred however, because it makes more efficient use of the light source and the electronics hereinafter described.

Continuing now with the embodiment in FIG. 2, a housing structure 28 is provided for holding the diode 12, the acoustic transducer 24, the encoder 16 and the photoconductive devices in their respective proper orientations. Preferably, the optical digital encoder 16 is a photo mask (i.e., a projection shadow mask) with 8 bit level regions of black and white for blocking or transmitting the light beam. The encoder could also be a mirror containing reflective and non-reflective regions. The digital photoconductive device 20 includes an array 30 of photoconductive elements rigidly affixed to the housing 28 and output leads 32 extending to a threshold detector 34. As will be described in more detail subsequently, the shape of the encoded beam is substantially identical with the shape of the array of photoconductive elements 30. In accordance with one feature of the invention, the acoustic transducer 24 includes a diaphragm 36 and a rotatable mirror 38. The diaphragm 36 is affixed to a first end of the mirror 38. The other end of the mirror 36 is affixed to a suspension wire 44. In operation, the output member moves in the direction of the arrows 46 in response to the acoustic energy 11 exerted on the diaphragm 36, and in consequence thereof, the mirror 38 rotates about the suspension wire thereby changing the manner in which the encoded beam impinges upon the array of photoconductive elements 30. It should be understood that the basic idea is to cause relative motion between the encoded beam and the photoconductive array. In FIG. 2, the array is fixed and the beam moves. However, it is also possible to keep the beam fixed and move the array. In such a case, the output member could be affixed to the array 30 which would be aligned normal to the encoded beam 18.

There are several additional preferred features in the embodiment of FIG. 2. For example, the normal orientation of the mirror is 45% with respect to the encoded beam. This facilitates the transducer structure since the diode may be affixed to a housing side wall while the array is affixed to the bottom of the housing. The mirror arrangement also has the advantage that as the mirror rotates through an angle $\theta$, the image appears as if it rotates through angle $2\times\theta$. This gives added displacement of the image, thus relaxing the requirements on the photoresistor resolution. Also, the ratio of the linear dimensions of the various regions on the array of photoconductive elements 30 to the linear dimensions of the regions on the mask 16 is equal to the sum of the distance between the source and the mask and the optical path between the mask and the array divided by the distance between the source and the mask.

In a preferred housing structure 28, the distance from light source to mask is 1 unit (i.e., 1 cm), and the distance from this mask to the array of photoconductive elements could be approximately 2 units (i.e., 2 cm); the ratio is thus equal to 3. Then, the photo mask linear dimensions would be projected 3× as large linearly onto the array of photoconductive elements 30.

Figure 3:
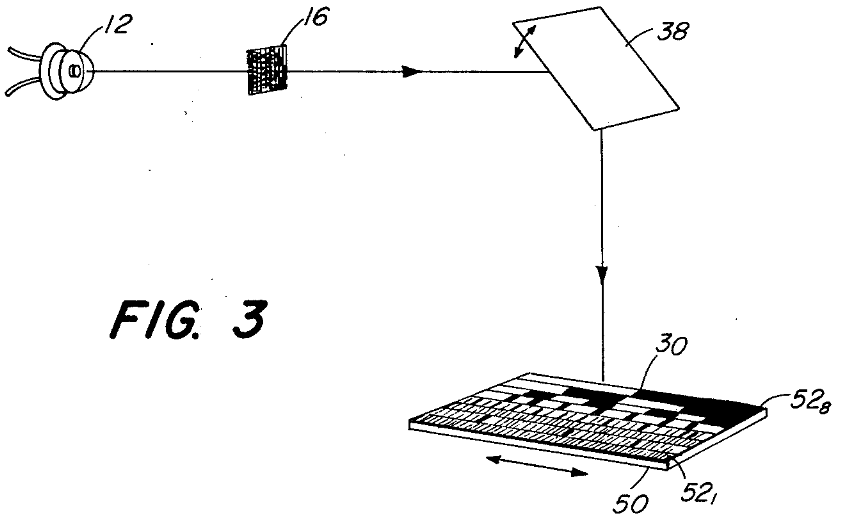
FIG. 3 is a perspective view of the mask, mirror and photoconductive device of the transducer according to the present invention.
Figure 4:
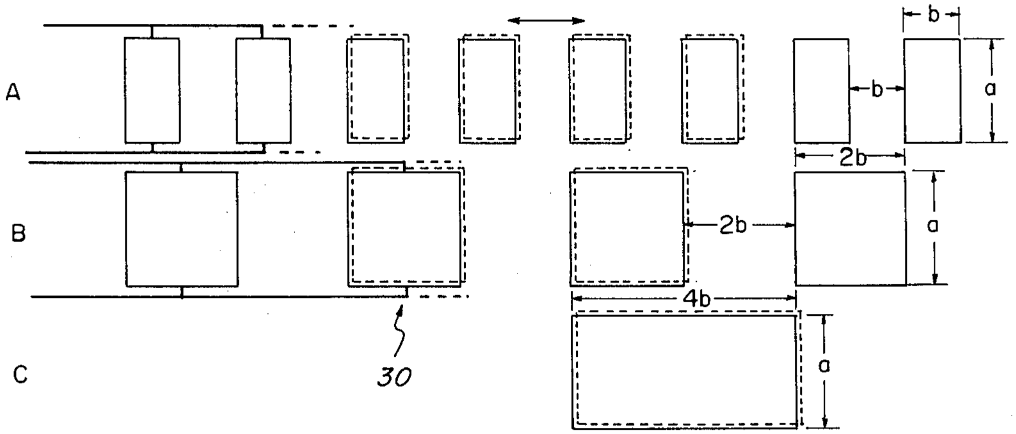
FIG. 4 is a diagram illustrating the interaction of portions of the encoded light beam and the photo conductive elements.

FIG. 3 illustrates in more detail the interaction between the mask 16 and the photoconductive device or array 30. In the preferred embodiment, the transducer produces an 8 bit digital word in which one bit indicates polarity and the other 7 bits indicate magnitude. FIG. 3 illustrates generally the geometry of the mask and the photoconductive device for generating an 8 bit digital pulse code. The dark regions on the mask 16 represent light blocking regions while the darkened area on the device 30 represent photoconductive thin film material. FIG. 4 shows more detail of this interaction of the encoded light beam from the mask and the photoconductive elements for the generation of three of the eight bits. The photoconductive device 30 has a substrate 50 which has a non-conductive planar surface. An array of N rows $52_1$ through $52_8$ of photoconductive thin film material is deposited upon the surface of the substrate 50 utilizing conventional photolithographic techniques.

FIG. 4 shows the interaction of the encoded beam (dotted lines) and the photoconductive elements (solid lines), the entire encoded beam being able to move in the directions indicated by the arrows. This figure, for simplicity, shows just 3 bits of the 8 bits in the preferred embodiment.

The most significant bit (line "C") has one area of photoresistance of dimension $a \times 4b$. The next significant bit (line B) has four areas of photoresistance of dimension $a \times 2b$, with edge-to-edge separation of $2b$. The least significant bit (line A) has eight areas of photoresistance of dimension $a \times b$, with edge-to-edge separation of $b$. These patterns are shown outlined in solid lines. The reason for the extra areas of photoresistance in B and A is to provide photosensitive regions at the full excursion positions of the light pattern. Without the extra regions, the signal from A and B would drop off from the 1 position output value giving false 0's.

The light pattern which is translated back and forth across the A, B and C array consists of a single area for C measuring $a \times 4b$, two areas for B each measuring $a \times 2b$, separated edge-to-edge by $2b$, and four areas for A measuring $a \times b$, separated edge-to-edge by $b$. The light patterns are shown dotted at the neutral position. A polarity bit is not shown. Preferably, a polarity bit is provided, and its implementation would include a photoconductive element having the same shape as element C and being adjacent to element C and a light pattern area associated with this element that is of the same area ($a \times b$) as those associated with row A and that has its left edge coincident with the left edge of the photoconductive element in the neutral position.

It is possible to achieve the same effect by interchanging the patterns used for the light pattern with that used for the photoresistors. Then the "mask" through which the LED light is projected would cast light patterns for A, B and C as outlined in solid lines. The photoresistance pattern would then be that shown outlined in dotted lines.

The connection of the photoresistors electrically should be in parallel as indicated partially in FIG. 4, since this gives the largest change in resistance for the excursion from light to dark. The normalized resistance excursion for $R_A$ and $R_B$ is from 1 to 1.5, for parallel connection, whereas for series connection it is from 1 to 1.33, (assuming the resistivity drops to ½ of its dark value).

The threshold between deciding whether a 1 is received or a 0 is received should be set midway between the resistance excursion. The threshold rule should be that any value of resistance between 100% of the resistance excursion (minimum area illuminated) down to and including 50% of the resistance excursion (50% of area illuminated) is called a 0, and any value of resistance from 0% to just below 50% of the resistance excursion (greater than 50 % of area illuminated) is called a 1. A region of uncertainty around the 50% level will exist as to whether a 1 or 0 is chosen at the sample time. No amount of offset can compensate for it, because no matter where it is chosen to be the uncertainty is there.

Within the limits of manufacturing, a practical uncertainty band of 1/10 the width of the least significant bit could be expected. For an 8 bit level system (±128 amplitude levels) this corresponds to making an error 10% of the time in the least significant bit decision or S/N of 20 db for it, which is acceptable since the uncertainty in the next significant bit is 5% or S/N of 26 db and so the S/N for each bit increases.

Figure 5:
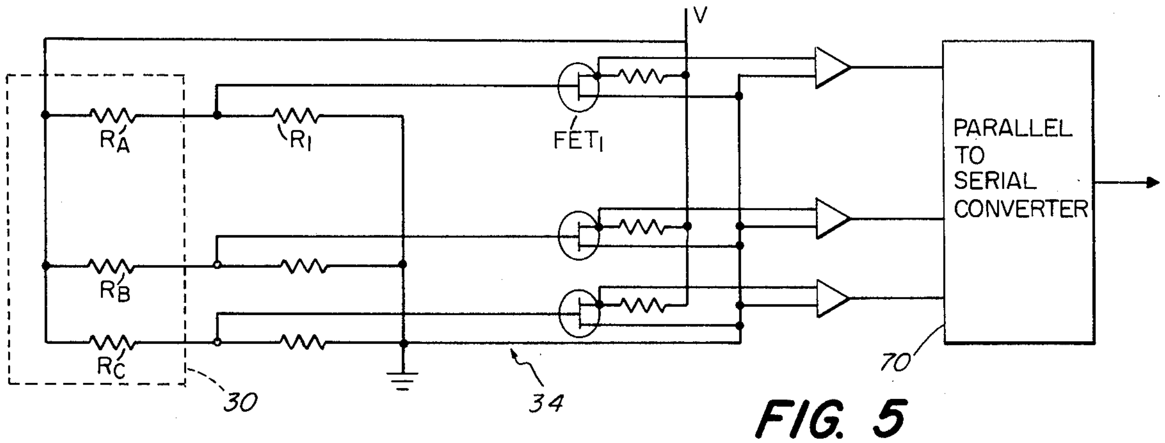
FIG. 5 is a diagram of the threshold logic for converting the resistance variations of the photoconductive elements into a digital pulse code.

FIG. 5 illustrates the threshold detector 34 for three of the eight bits. The photoresistors are shown as $R_A$, $R_B$ and $R_C$. Only the circuit for $R_A$ is described since the others operate identically. A bias resistor $R_1$ is connected in series with $R_a$ and a bias voltage V is applied across the series combination of $R_A$ and $R_1$. When $R_A$ reaches the proper value, a field effect transistor (FET) turns on, providing a logic 1 input to an amplifier. Preferably the bits are applied to a parallel to serial converter 70.

The following table illustrates the operation of the encoded beam and photoconductive elements shown in FIG. 4 for producing a three bit digital output signal. The first column (P) designates each of eight positions when the beam moves to the right (R) and each of eight positions when the beam moves to the left (L). The last column (*d*) shows the distance covered by the beam for each position. The columns designated A, B and C illustrate the logic level of each of the respective bits. The three columns designated % Ex. for A, B and C represent the percent of maximum resistance excursion of the respective A, B and C photoconductive elements. For example, if % Ex. of A is <50, it means the normalized resistance of $R_A$ is <1.25. The symbols > and < mean greater than and less than, respectively. In FIG. 4, which shows the actual neural position, the encoded beam is offset slightly from the photoconductive elements.

| P | A | A % Ex. | B | B % Ex. | C | C % Ex. | d |
|---|---|---|---|---|---|---|---|
| 8R | 1 | <100 | 1 | <100 | 0 | >0 | 4.0b |
| 7R | 1 | >50 | 1 | >75 | 0 | <12.5 | 3.5b |
| 6R | 0 | >0 | 1 | >50 | 0 | <25 | 3.0b |
| 5R | 0 | <50 | 0 | >25 | 0 | <37.5 | 2.5b |
| 4R | 1 | <100 | 0 | >0 | 0 | <50 | 2.0b |
| 3R | 1 | >50 | 0 | <25 | 1 | <62.5 | 1.5b |
| 2R | 0 | >0 | 0 | <50 | 1 | <75 | 1.0b |
| 1R | 0 | <50 | 1 | <75 | 1 | <87.5 | 0.5b |
| 0 | 1 | <100 | 1 | <100 | 1 | <100 | 0 |
| 1L | 1 | >50 | 1 | >75 | 1 | >87.5 | 0.5b |
| 2L | 0 | >0 | 1 | >50 | 1 | >75 | 1.0b |
| 3L | 0 | <50 | 0 | >25 | 1 | >62.5 | 1.5b |
| 4L | 1 | <100 | 0 | >0 | 1 | >50 | 2.0b |
| 5L | 1 | <50 | 0 | <25 | 0 | >37.5 | 2.5b |
| 6L | 0 | >0 | 0 | <50 | 0 | >25 | 3.0b |
| 7L | 0 | <50 | 1 | <100 | 0 | >12.5 | 3.5b |

-continued

| P | A | A % Ex. | B | B % Ex. | C | C % Ex. | d |
|---|---|---|---|---|---|---|---|
| 8L | 1 | <100 | 1 | <50 | 0 | >0 | 4.0b |

As stated previously, the use of a polarity bit would permit differentiation between the digital output of A, B and C due to movement to the left and movement to the right. Transitions between positions 8R and 7R and between positions 0 and 1L are not differentiated but this uncertainty is acceptable for digitized telephonic speech. It may be observed that the purpose of the extra element for $R_A$ and $R_B$ in FIG. 4 is to cause the continuing required variation in % Ex. of A and B movement out to positions 8R and 8L.

The embodiments of the present invention are merely exemplary and those skilled in the art will be able to make numerous variations and modifications of them without departing form the spirit of the invention. All such variations and modifications are intended to be included within the scope of the present invention as defined in the appended claims.

I claim:

1. An optically encoded transducer for use in a telephone handset for converting analog acoustic energy into an electrical digital pulse code comprising:

a. source of optical power for generating a beam of light along a predetermined path, b. means disposed in the path for encoding the beam into a preselected pattern of light having a plurality of rows of alternating regions in which light is present and in which light is absent, the areas of the regions in the respective rows being related by factors of two to define a binary weighted relationship between the rows of regions, c. an array of thin film photoconductive elements, having a plurality of rows of spaced photoconductive elements, the areas of the elements in the respective rows being related by factors of two to define a binary weighted relationship between the rows of elements, the array being disposed in the path of encoded beam such that a row of regions impinges upon a defined row of photoconductive elements, the shapes and areas of corresponding regions and elements in rows of the array and the encoded beam being substantially equal as the encoded beam impinges the array, the photoconductive elements of each row being electrically interconnected and generating a value of resistance which is related to the relative position of the light containing regions with respect to the photoconductive elements, d. the number of photoconductive elements in any row except that having the greatest binary weighted value being twice the number of light containing regions in a corresponding row of the encoded beam so that the resistance of each row varies between a first level in which all elements are not exposed to light and a second level where one-half the elements are exposed to light, e. means responsive to the acoustic energy for effecting relative motion between the array and the encoded beam in a direction parallel to the rows to vary the resistance of each row of elements between the first and second levels, and f. means for establishing a threshold level between the first and second levels and for generating first and second digital voltages for each of the plurality of rows of photoconductive elements depending upon whether the resistance level is above or below the threshold level.

2. The transducer according to claim 1 wherein the source includes a pulsed light emitting diode.

3. The transducer according to claim 1 wherein the encoding means includes a mask disposed along the path, the mask having light transmitting and light blocking regions.

4. The transducer according to claim 1 wherein the photoconductive elements in each row are connected in parallel to maximize the excursion between the first and second levels of resistance.

5. The transducer according to claim 2 further including means for converting the output of the threshold level establishing means into serial form for transmission.

6. The transducer according to claim 1 wherein the resistance threshold level is 50% of the excursion between the first and second resistance levels.

7. The transducer according to claim 1 wherein the array is fixed and the means for effecting relative motion between the encoded beam and the array includes means for deflecting the encoded beam as a function of the acoustic energy.

8. The transducer according to claim 7 wherein the deflecting means includes a mirror having a reflective surface and being located in the path of the encoded beam, and means for changing the angle of incidence of the encoded beam to the reflective surface by rotating the mirror about an axis of the mirror, the photoconductive elements being located in the path of the encoded beam reflected from the mirror.

9. The transducer according to claim 8 wherein means for changing the angle of incidence includes a diaphragm for receiving the acoustic energy, the diaphragm having an output member connected to a first side of the mirror and a suspension wire affixed to the other side of the mirror so that the mirror may rotate about the suspension wire.

10. The transducer according to claim 9 wherein the nominal angle of the mirror to the encoded beam is 45°.

11. The transducer according to claim 9 wherein for a rotation of the mirror through an angle $\theta$, the image of the encoded beam on the photoconductive array appears as though rotated through an angle of $2\theta$.

12. The transducer according to claim 9, wherein the ratio of the linear dimensions of the elements to the linear dimensions of the regions on the mask is equal to the sum of the distance between the source and the mask and the optical path between the mask and the photoconductive elements divided by the distance between the source and the mask.

13. The transducer according to claim 12, wherein the ratio is three.

* * * * *